United States Patent [19]

Okumura et al.

[11] Patent Number: 4,953,125
[45] Date of Patent: Aug. 28, 1990

[54] SEMICONDUCTOR MEMORY DEVICE HAVING IMPROVED CONNECTING STRUCTURE OF BIT LINE AND MEMORY CELL

[75] Inventors: Yoshinori Okumura; Akihiko Ohsaki; Kazuyuki Sugahara; Tatsuhiko Ikeda, all of Hyogo, Japan

[73] Assignee: Mitsubishi Denki Kabushiki Kaisha, Tokyo, Japan

[21] Appl. No.: 173,749

[22] Filed: Mar. 25, 1988

[30] Foreign Application Priority Data

Mar. 25, 1987 [JP] Japan .................................. 62-72214

[51] Int. Cl.⁵ ...................... G11C 11/40; H01L 29/78
[52] U.S. Cl. ..................................... 365/149; 365/185; 365/63; 357/23.6; 357/55
[58] Field of Search ............... 365/149, 51, 63, 185, 365/189.03; 357/23.6, 55

[56] References Cited

U.S. PATENT DOCUMENTS

| | | | |
|---|---|---|---|
| 4,792,834 | 12/1988 | Uchida .............................. | 365/149 |
| 4,811,067 | 5/1989 | Fitzgerald et al. ................ | 365/149 |
| 4,814,840 | 3/1989 | Kameda ............................ | 365/185 |
| 4,816,884 | 5/1989 | Hwang et al. ................ | 357/23.6 X |
| 4,819,052 | 4/1989 | Hutter ................................ | 357/55 |
| 4,819,054 | 4/1989 | Kawaji et al. .................... | 357/23.6 |

OTHER PUBLICATIONS

IBM Tech. Discl. Bull. vol. 31, No. 4, Sep. 88, pp. 245–248, "Baried-Contact***Trench Isolation" by IBM Corp.
IBM Tech. Discl. Bull., vol. 31, No. 5, Oct. 88, pp. 155–156, "Nested Two Trench P+ Contact".
IEDM 84: "An Isolation-Merged Vertical Capacitor Cell For Large Capacity DRAM", by S. Nakajima et al., 9.4, 1984 pp. 240–243.

Primary Examiner—Stuart N. Hecker
Assistant Examiner—Alfonso Garcia
Attorney, Agent, or Firm—Lowe, Price, LeBlanc, Becker & Shur

[57] ABSTRACT

A semiconductor memory device includes a first trench serving as a memory cell formed in a p type semiconductor substrate, a first n type semiconductor region formed adjacent to the trench region and on the major surface of the semiconductor substrate, a conductive layer serving as an electron active region formed adjacent to the first n type region and on the major surface of the semiconductor substrate, a second n type semiconductor region formed adjacent to the electron active region and on the major surface of the semiconductor substrate, a second trench formed adjacent to the second n type semiconductor region in the major surface of the semiconductor substrate which is shallower than the first trench, an interconnection layer serving as a bit line formed in a self-aligning manner in the sidewall portion of the second trench which is shallower than the first trench and a gate electrode serving as a word line formed in the upper portion of the conductive layer through an oxide film.

9 Claims, 7 Drawing Sheets

SEMICONDUCTOR MEMORY DEVICE HAVING IMPROVED CONNECTING STRUCTURE OF BIT LINE AND MEMORY CELL

BACKGROUND OF THE INVENTION

1. Field of the Invention

The present invention relates generally to a connection structure of an interconnection and an electron active region such as a doped layer in a semiconductor device and more particularly, to an improvement of the connection structure of an interconnection and an electron active region in a dynamic semiconductor memory device having memory cells of a trench type.

2. Description of the Prior Art

A dynamic semiconductor memory device has been already well-known. FIG. 1 is a block diagram showing an entire structure of the conventional dynamic semiconductor memory device.

Referring to FIG. 1, the dynamic semiconductor memory device comprises an array including a plurality of memory cells which are memory portions, respectively, an X decoder and a Y decoder for selecting addresses of the memory cells, and an input/output interface portion comprising sense amplifiers connected to input/output buffers. The plurality of memory cells are connected to intersections of word lines connected to the X decoder and bit lines connected to the Y decoder, the word lines and the bit lines constituting a matrix. In the above described manner, the above described array is structured.

Description is now made on operation. A memory cell is selected which is connected to an intersection of each of the word lines and each of the bit lines selected by the X decoder and the Y decoder, respectively, in response to a row address signal and a column address signal externally applied, from or to which information is read out or written through the input/output interface portion comprising the sense amplifiers and the input/output buffers.

FIGS. 2A and 2B are diagrams showing a structure of a memory cell in the conventional dynamic semiconductor memory device, where FIG. 2A is a plan view thereof and FIG. 2B is a cross sectional view taken along a line IIB—IIB shown in FIG. 2A.

The conventional dynamic semiconductor memory device comprises a memory cell comprised of a single transistor and a single capacitor, the capacitor comprising a capacitor of a trench structure for high integration density of the memory cell. Referring to FIG. 2B, a trench 3 is formed in a p type silicon substrate 1. An n type diffusion layer 6 is formed on the side surface of the trench 3. An n type diffusion layer 2 is formed around the trench 3 and in the planer surface of the substrate 1. A polysilicon (polycrystalline silicon) layer 8 serving as a cell plate is formed on the bottom surface of the trench and in the upper portions of the n type diffusion layers 2 and 6 through a thin oxide film 7. An isolation oxide film 5 is formed in the bottom portion of the trench 3 and an inversion preventing layer 4 is formed adjacent to and under the isolation oxide film 5. The n type diffusion layers 2 and 6, the polysilicon layer 8 and the thin oxide film 7 interposed therebetween constitute a capacitor for storing information charges.

n type diffusion layers 10 are formed spaced apart from each other, adjacent to the n type diffusion layer 2 and in the planer surface of the substrate 1. Polysilicon 9 serving as a word line is formed over the portion between the n type diffusion layers 10. The polysilicon 9 and the n type diffusion layers 10 constitute an n channel transistor for reading out and writing information charges. The n type diffusion layer 10 is connected to an aluminum interconnectlon 13 serving as a bit line through a contact hole 12. The major surface of the p type substrate 1 and the inside of the trench 3 are covered with an insulating film 11.

Description is now made on operation of the conventional semiconductor memory device shown in FIGS. 2A and 2B.

A voltage is applied to the word line 9, so that the conductivity type of the surface region of the semiconductor substrate 1 immediately under the word line 9 is inverted, whereby a channel is formed between the two n type diffusion layers 10.

When information charges are written, a voltage is applied to the bit line 13. As a result, the charges are carried to the capacitor diffusion layers 2, 6, 7 and 8 from the bit line 13 through the contact hole 12, the one diffusion layer 10, the above described channel and the other diffusion layer 10.

On the other hand, when information charges are read out, the charges are carried from the capacitor diffusion layers 2, 6, 7 and 8 to the bit line 13.

A semiconductor memory device of the same trench type, but having a different shape is described in an article by Nakajima et al., entitled "An Isolation-Merged Vertical Capacitor Cell for Large Capacity DRAM", IEDM, 1984, pp. 240–243. In this case, the positional relation of a word line, a contact hole and the like are also the same as that shown in FIGS. 2A and 2B. In addition the manufacturing method comprises a photolithographic process, similarly to the conventional manufacturing method.

Since the conventional semiconductor memory device has the above described structure, the contact hole 12 and the word lines 9 are formed at the same level. As a result, the planer area occupied by a memory cell is increased.

On the other hand, the contact hole 12 is formed by applying a photolithographic process and an etching process to the insulating film 11 between interconnection layers. In order to use the photolithographic process, a size shift of resist, an offset of alignment and a size shift by etching must be avoided.

As described in the foregoing, in the conventional semiconductor memory device, it was difficult to increase the density of a memory device and provide high integration density thereof.

SUMMARY OF THE INVENTION

Therefore, an object of the present invention is to provide a semiconductor memory device in which the planer area occupied by a memory cell can be decreased.

Another object of the present invention is to provide a method for connecting to interconnection of the semiconductor device comprising few photolithographic processes.

The above described objects of the present invention can be achieved by bringing an electron active region into direct contact with the interconnection layer, without using a contact hole.

Briefly stated, the semiconductor memory device according to the present invention has the following connection structure. More specifically, a groove is formed in the major surface of a semiconductor substrate, a conductive layer is formed on the side surface of the groove and an interconnection layer is formed adjacent to and on the side surface of the conductive layer.

Since the semiconductor memory device according to the present invention has the above described structure, the planer area occupied by the memory cell can be decreased.

According to the preferred embodiment, a semiconductor memory device is manufactured in which a trench region serving as a memory cell is formed on a semiconductor substrate using a photolithographic process, an electron active region is formed adjacent to the trench region and in the major surface of the semiconductor substrate, a trench which is shallower than the above described trench is formed adjacent to the electron active region and in the major surface of the semiconductor substrate, an interconnection layer is formed in the sidewall portion of the shallower trench in a self-aligning manner and a gate electrode serving as a word line is formed over the conductive layer through an oxide film.

Since the semiconductor memory device is formed in the above described manner, a method for manufacturing the semiconductor memory device comprising few photolithographic processes can be provided.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
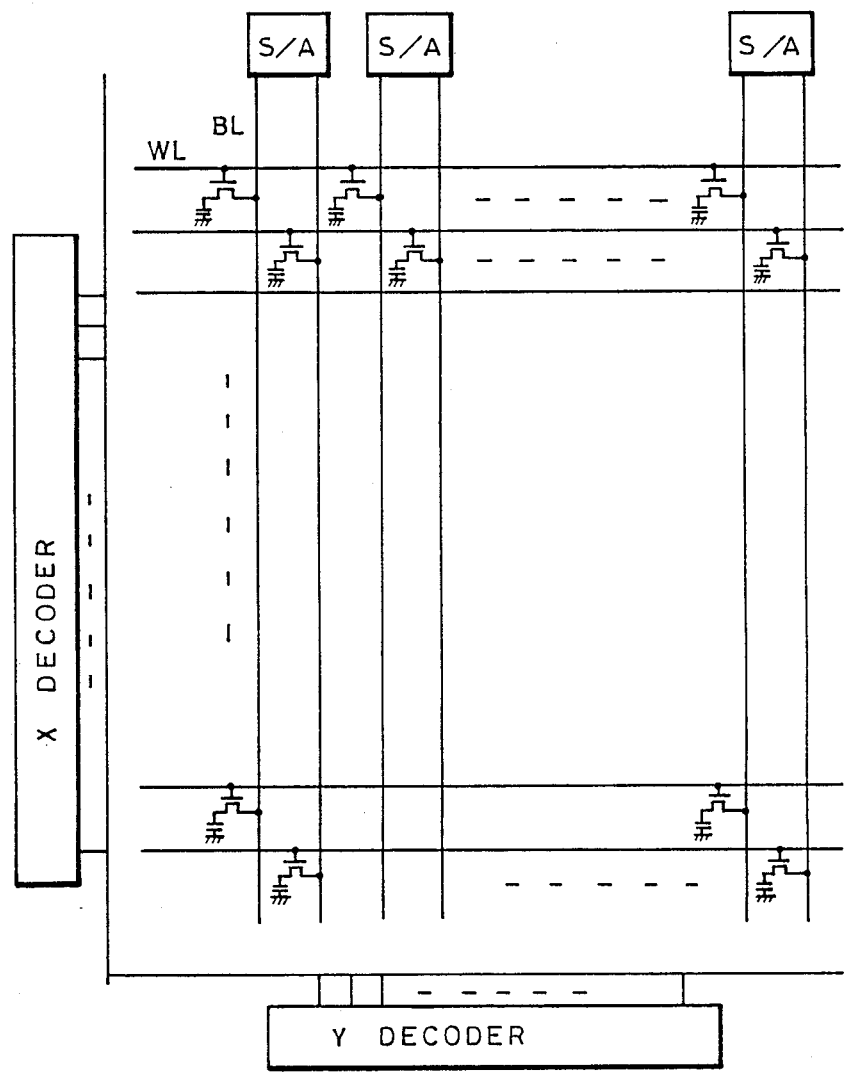
FIG. 1 is a block diagram showing an entire structure of a dynamic semiconductor memory device.

Referring to the drawings, an embodiment of the present invention will be described. Description is made on a case in which the present invention is applied to a semiconductor memory device.

FIGS. 3A to 3E are diagrams showing schematically processes for forming a semiconductor memory device according to an embodiment of the present invention.

Figure 3A:
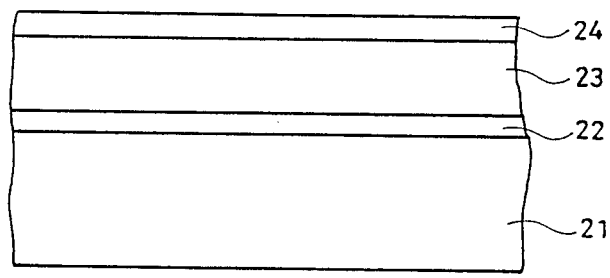
FIGS. 3A to 3E are diagrams showing a method for manufacturing a semiconductor device according to the present invention.

Referring to FIG. 3A, an insulating film 22 is formed on a semiconductor substrate 21. In addition, polysilicon is deposited on the insulating film 22 by a CVD process and monocrystalized by a zone melting process or the like, so that a monocrystalline silicon film 23 is formed. Ions of the same conductivity type as that of the semiconductor substrate 21 are doped into the monocrystalline film 23. Furthermore, an insulating film 24 is formed on the monocrystalline silicon film 23.

Figure 3B:
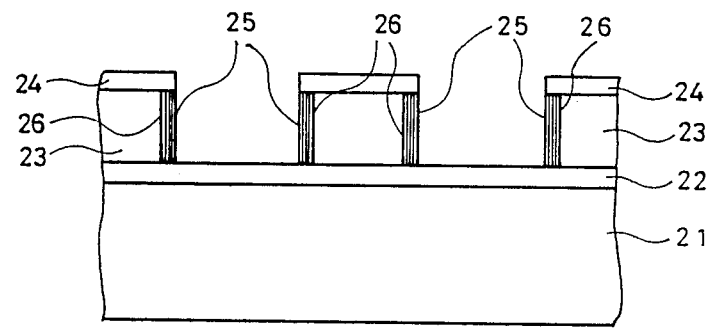

Referring to FIG. 3B, trenches 25 are formed from the insulating film 24 to the insulating film 22 using a photolithographic process. Impurity diffusion layers 26 of a conductivity type opposite to that of the semiconductor substrate 21 are formed in the sidewall portions of each of the trenches 25 by a process such as oblique ion implantation.

Figure 3C:
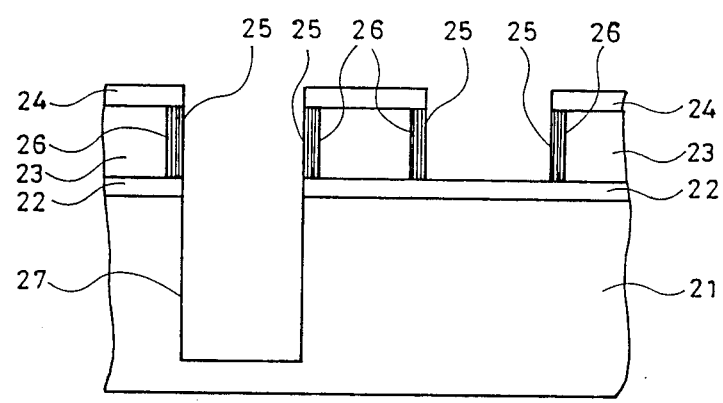

Referring to FIG. 3C, one of the trenches is formed deeper. As a result, a trench 27 extending from the insulating film 22 to the semiconductor substrate 21 is formed.

Figure 3D:
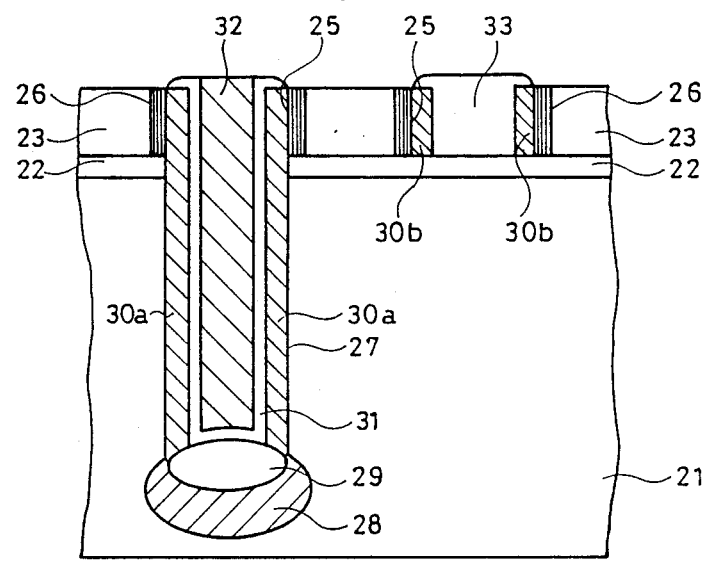

Referring to FIG. 3D, in order to form isolation on the bottom surface of the trench 27, an impurity diffusion layer 28 of the same conductivity type as that of the semiconductor substrate 21 is formed and then, a thick isolation oxide film 29 is formed.

Polysilicon is then deposited on the entire surface and the polysilicon is formed only in the sidewall portions of the trenches 25 and 27 by etching back. Thereafter, an electrode 30a and a bit line 30b in a capacitor region are formed without using a photolithographic process.

A thin oxide film 31 for a capacitor is formed in the capacitor region and the trench is filled with a cell plate 32 using polysilicon.

Thereafter, an insulating film 33 such as an oxide film is formed in the trench 25.

Figure 3E:
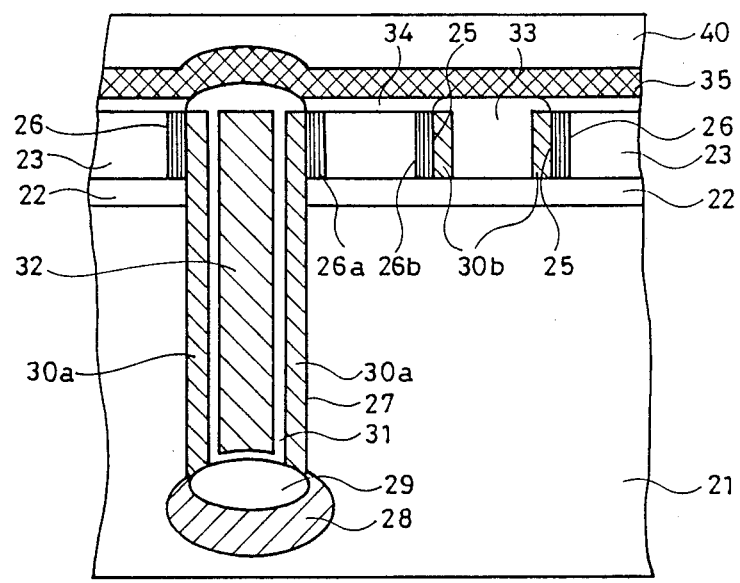

Referring to FIG. 3E, a gate oxide film 34 is formed in the planer region and a word line 35 is formed thereon. In addition, an insulating film 40 is formed on the word line 35.

In the above described manner, there is provided a semiconductor memory device according to an embodiment of the present invention shown in a cross sectional view of FIG. 3E.

Description is now made on operation of the semiconductor memory device according to an embodiment of the present invention.

Referring to FIG. 3E, a voltage is applied to the word line 35. As a result, the conductivity type of the surface region of the monocrystalline silicon film 23 immediately under the word line 35 is inverted through the gate oxide film 34, where a channel is formed. Consequently, conduction between the diffusion layers 26a and 26b occurs.

A voltage is then applied to the bit line 30b. The voltage causes charges to be carried to the polysilicon 30a through the diffusion layer 26b, the channel and the diffusion layer 26a.

Referring to FIG. 3E, it is understood that the polysilicon 30a, the thin oxide film 31 and the cell plate 32 comprising polysilicon constitute a capacitor region. Charges are stored in the capacitor region. As a result, the semiconductor device is employed as a memory device.

In the above described structure, the bit line 30b is formed on the sidewall of the trench 25 and brought into direct contact with the diffusion layer 26b. Thus, since the word line 35 and the bit line 30b are formed at different levels, a device having high integration density can be formed.

Another advantage of the present embodiment is that when the bit line 30b is formed in the sidewall portion of the trench 25, a contact surface to which the bit line 30b is electrically connected is formed in a self-aligning manner.

Description is now made on the contact surface formed in a self-aligning manner.

Figure 2A:
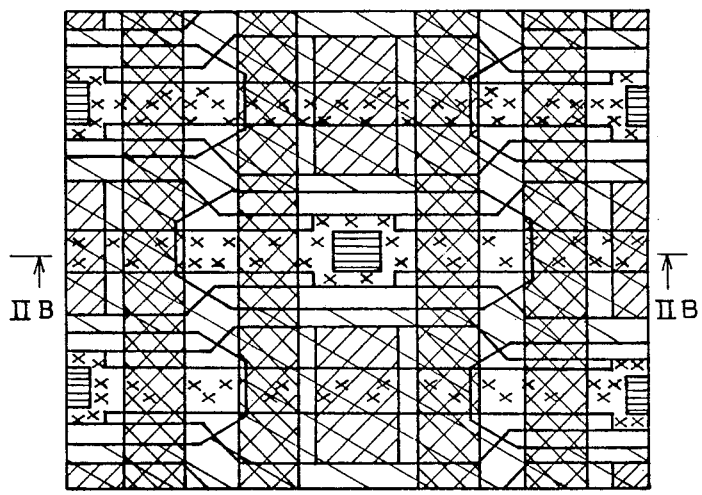
FIGS. 2A and 2B are diagrams showing a structure of a memory cell of the conventional semiconductor memory device.
Figure 2B:
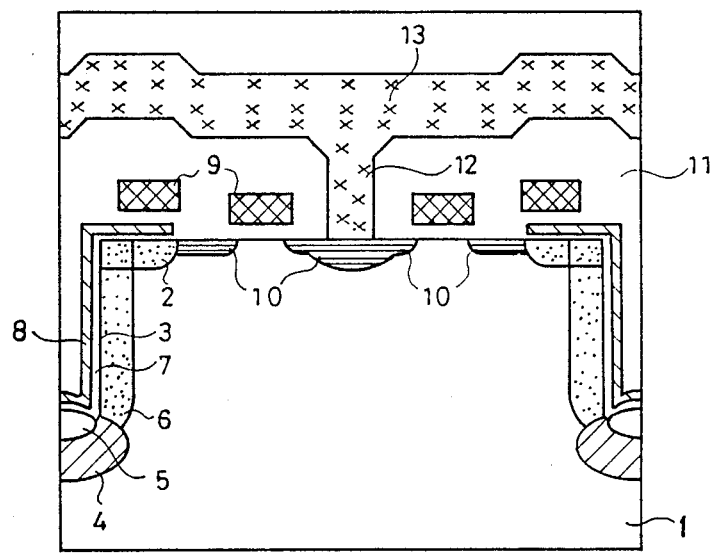
Figure 4A:
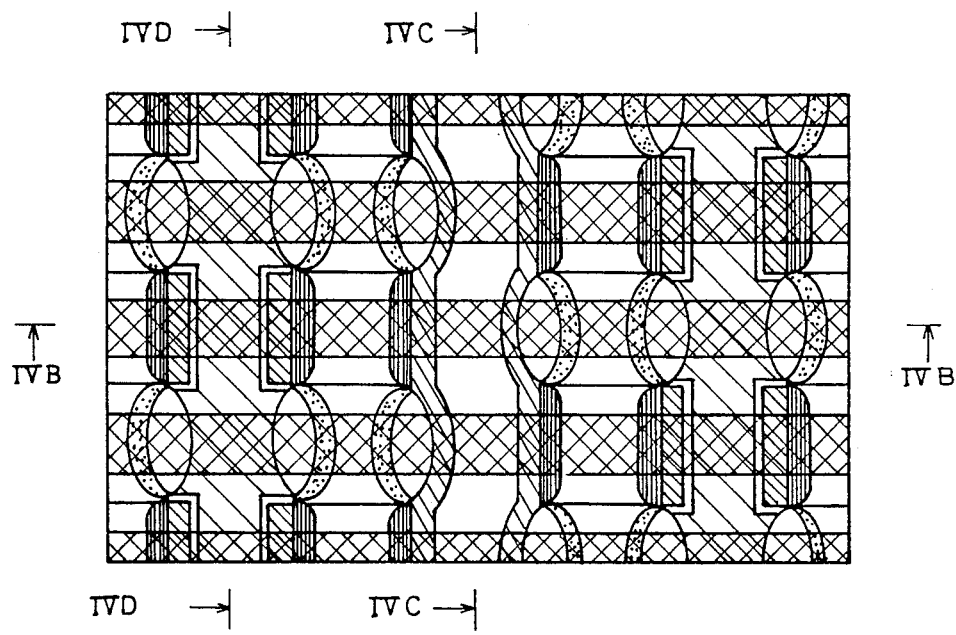
FIG. 4A is a plan view of a semiconductor memory device according to an embodiment of the present invention.

FIG. 4A is a plan view showing a layout of the semiconductor memory device according to an embodiment of the present invention. Comparison of FIG. 4A with FIG. 2A shows the following. The directions in which the word line 35 and the bit line 30b extend in plane in FIG. 2A are opposite to those shown in FIG. 4A. More specifically, the word line 35 is parallel to the trench 27 in FIG. 2A, whereas the bit line 30b is parallel to the trench 27 in FIG. 4A.

Figure 4B:
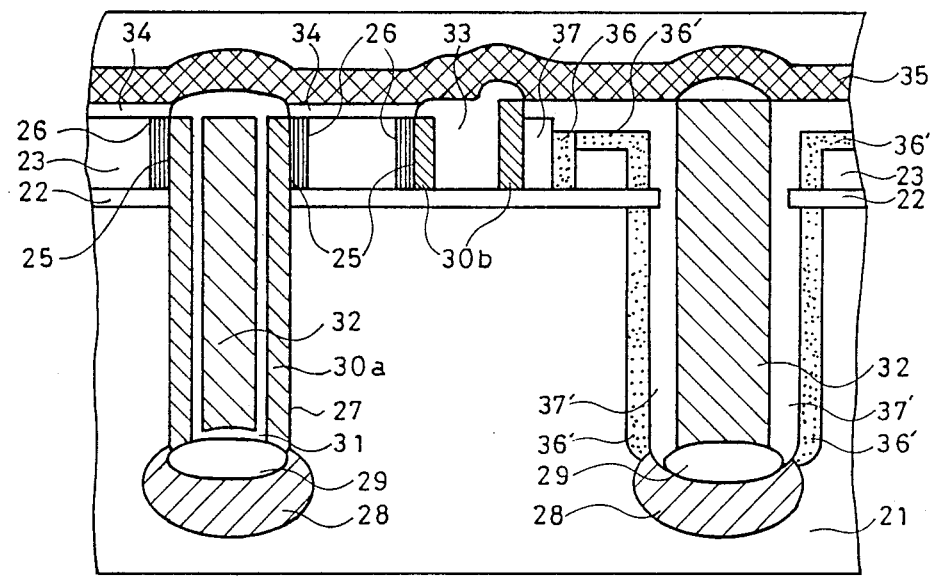
FIG. 4B is a cross sectional view taken along a line IVB—IVB shown in FIG. 4A.
Figure 4C:
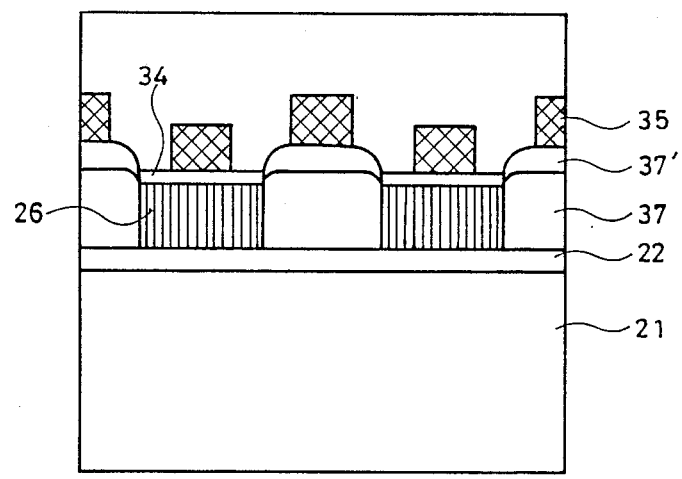
FIG. 4C is a cross sectional view taken along a line IVC—IVC shown in FIG. 4A.
Figure 4D:
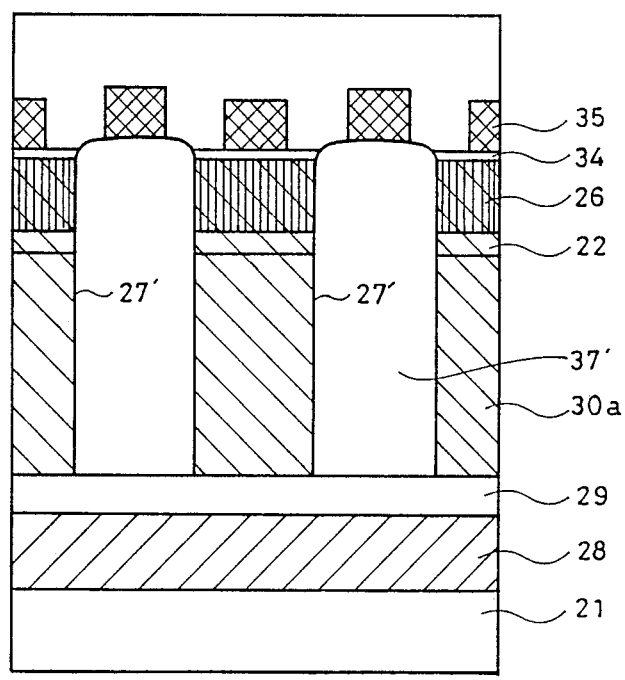
FIG. 4D is a cross sectional view taken along a line IVD—IVD shown in FIG. 4A.

FIG. 4B is a cross sectional view of a portion taken along a line IVB—IVB in FIG. 4A, FIG. 4C is a cross sectional view of a portion taken along a line IVC—IVC in FIG. 4A, and FIG. 4D is a cross sectional view viewed in the direction of an arrow from a line IVD-IVD shown in FIG. 4A.

Figure 4E:
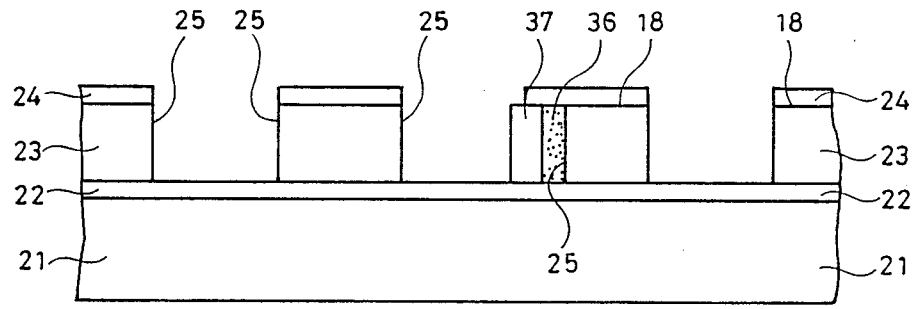
FIGS. 4E and 4F are diagrams showing processes forming a contact surface in the sidewall portion of a trench in a self-aligning manner.
Figure 4F:
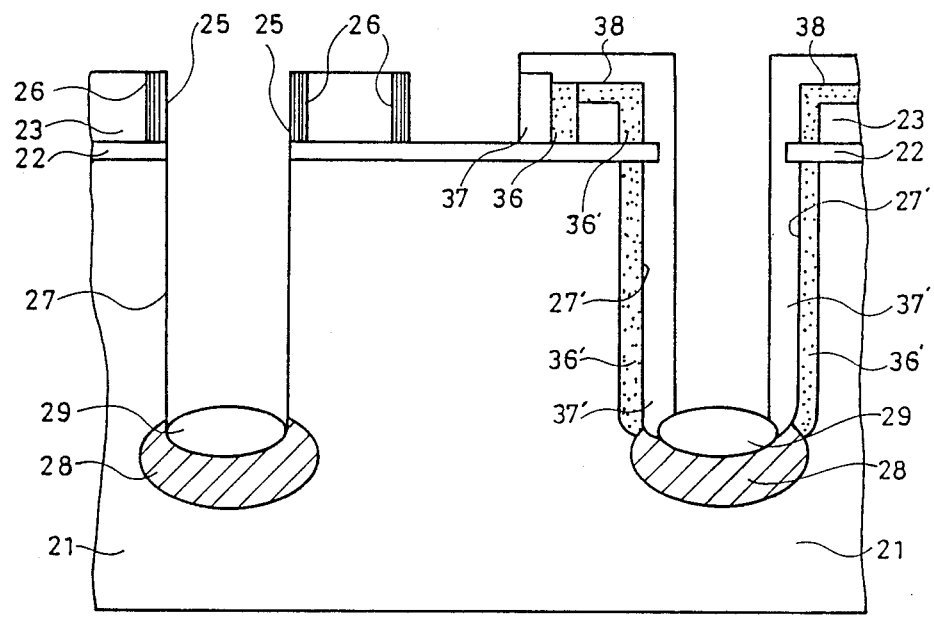

FIGS. 4E and 4F are diagrams showing processes for forming a contact surface in the sidewall portion of the trench 25 in a self-aligning manner.

A semiconductor memory device according to the present invention including FIGS. 4E and 4F is formed in accordance with the following processes: FIG. 3A→ FIG. 4E→FIG. 3B→FIG. 3C→FIG. 4F→FIG. 3D→FIG. 3E.

In FIGS. 4A, 4B, 4E and 4F, not only a memory cell but also an isolation region adjacent to the memory cell is included, for the purpose of describing the above described contact region formed in a self-aligning manner.

The process shown in FIG. 3A is completed and then, trenches 25 are formed in the substrate 21 as shown in FIG. 4E. Thereafter, an impurity diffusion layer 36 of the same conductivity type as that of the semiconductor substrate 21 and a thick isolation oxide film 37 are selectively formed in the sidewall portion of one of the trenches 25 by oblique ion implantation or the like. The processes shown in FIGS. 3B and 3C are completed and then, a deep trench 27' for isolation is formed and layers as described below are formed in the trench 27' as shown in FIG. 4F. More specifically, an impurity diffusion layer 28 of the same conductivity type as that of the semiconductor substrate 21 and a thick isolation oxide film 29 are formed in the bottom portion of the trench 27'. Thereafter, an impurity diffusion layer 36' of the same conductivity type as that of the semiconductor substrate 21 and a thick isolation oxide film 37' are selectively formed by a process such as oblique ion implantation in the sidewall portion and the planer portion 28 of the trench 27' in the same manner as that for forming the diffusion layer 36 and the isolation oxide film 37.

FIGS. 4C and 4D are the other cross sectional views of a memory cell portion and an isolation region formed by the above described steps. In FIG. 4D, for easy understanding and simplicity the cell plate 32 is omitted. Referring to FIG. 4C, an active region formed in the sidewall portion of the trench 25 is interposed between thick isolation oxide films. The active region is a contact surface formed in a self-aligning manner.

Referring to FIG. 4D, an active region formed in the sidewall portion of the trench 27' is interposed between thick isolation oxide films. The active region is a contact surface formed in a self-aligning manner.

Thereafter, as described above, the semiconductor memory device according to an embodiment of the present invention is manufactured through a process shown in FIG. 3D and the subsequent processes.

In the above described embodiment, description was made on a case in which the present invention is applied to the semiconductor memory device. It should be noted that the present invention is not limited to the semiconductor memory device. For example, the present invention can be also applied to another semiconductor memory device comprising a predetermined electron active region and an interconnection connected thereto.

As described in the foregoing, according to the present invention, a trench is formed in a position adjacent to a predetermined electron active region in the surface region of a semiconductor substrate and an interconnection layer is formed on the sidewall of the trench. As a result, since the electron active region and the interconnection are brought into direct contact with each other, high integration and high integration density of a semiconductor device can be achieved.

Additionally, in accordance with the preferred embodiment of the present invention, a structure is formed in which an active region is interposed between thick isolation oxide films in the sidewall portion of the trench. As the active region is separated by the above described thick oxide films, a bit line is brought into direct contact with the diffusion layer in a self-aligning manner. As a result, the accuracy of alignment of mask layers around the contact surface in the process can be improved and the planer area occupied by a cell can be decreased, so that a semiconductor memory device capable of having increased capacity can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate comprising a first layer of a first conductivity type having a predetermined impurity concentration, a first insulating layer formed on said first layer of the first conductivity type and a second layer of the first conductivity type having a major surface formed on said first insulating layer,
    said semiconductor substrate having a trench formed through said first layer of the first conductivity type, said first insulating layer and said second layer of the first conductivity type,
    a first layer of a second conductivity type formed in a region of said second layer of the first conductivity type and in the sidewall portion of said trench,
    a second layer of the second conductivity type formed spaced apart, by predetermined spacing, from said first layer of the second conductivity type in said second layer of the first conductivity type,
    a first conductive layer formed adjacent to said second layer of the second conductivity type in said second layer of the first conductivity type,
    a third layer of the second conductivity type formed on the sidewall of said trench at least on the side of a portion in which said first layer of the second conductivity type is formed, a second insulating layer formed on the sidewall and in the bottom portion of said trench having said third layer of the second conductivity type formed, a second conductive layer formed on the surface of said third insulating layer on the sidewall and the bottom surface of said trench, said third layer of the second conductivity type, said second insulating layer and said second conductive layer constituting a capacitor of a memory cell, a third insulating layer formed in the upper portion of said trench on said major surface, and a third conductive layer formed on said third insulating layer, said second layer of the first conductivity type, said first layer of the second conductivity type, said second layer of the second conductivity type and said third conductive layer constituting a semiconductor element.

2. A semiconductor device according to claim 1, wherein said semiconductor element comprises a field effect element.

3. A semiconductor device according to claim 2, wherein said field effect element comprises a field effect transistor in which said third conductive layer is a gate electrode, said first layer of the second conductivity type and said second layer of the second conductivity type are any of the a drain region and a source region, respectively, and the major surface of said second layer of the first conductivity type interposed between said first layer of the second conductivity type and said second layer of the second conductivity type is a channel region.

4. A semiconductor device according to claim 3, wherein said semiconductor device comprises a semiconductor memory device.

5. A semiconductor device comprising:

a semiconductor substrate comprising a first layer of a first conductivity type having a predetermined impurity concentration, a first insulating layer formed on said first layer of the first conductivity type and a second layer of the first conductivity type having a major surface formed on said first insulating layer, said semiconductor substrate having a trench formed through said first insulating layer and said second layer of the first conductivity type, a first layer of a second conductivity type formed in a region of said second layer of the first conductivity type and in the sidewall portion of said trench, a second layer of the second conductivity type formed spaced apart, by predetermined spacing, from said first layer of the second conductivity type in said second layer of the first conductivity type, a first conductive layer formed adjacent to said second layer of the second conductivity type in said second layer of the first conductivity type, a third layer of the second conductivity type formed on the sidewall of said first trench at least on the side of a portion in which said first layer of the second conductivity type is formed, a second insulating layer formed on the sidewall and in the bottom portion of said trench having said third layer of the second conductivity type formed, a second conductive layer formed on the surface of said third insulating layer on the sidewall and the bottom surface of said trench, said third layer of the second conductivity type, said second insulating layer and said second conductive layer constituting a capacitor of a memory cell, a third insulating layer formed in the upper portion of said trench on said major surface, and a third conductive layer formed on said fourth insulating layer, said second layer of the first conductivity type, said first layer of the second conductivity type, said second layer of the second conductivity type and said third conductive layer constituting a semiconductor element, said semiconductor element comprising a field effect element, said field effect element comprising a field effect transistor in which said third conductive layer is a gate electrode, said first layer of the second conductivity type and said second layer of the second conductivity type are any of a drain region and a source region, respectively, and the major surface of said second layer of the first conductivity type. interposed between said first layer of the second conductivity type and said second layer of the second conductivity type is a channel region, said semiconductor service comprising a semiconductor memory device, wherein said semiconductor substrate has a second trench formed spaced apart, by predetermined spacing, from said trench in said second layer of the first conductivity type, said second layer of the second conductivity type and said first conductive layer are formed in the sidewall portion of said second trench, and said second insulating layer is formed inside said second trench.

6. A semiconductor device according to claim 5, wherein said semiconductor memory device comprises a plurality of capacitors of said memory cell and a plurality of said field effect transistors, a thick insulating film formed under said trench, and a third layer of the first conductivity type formed under said thick insulating film, whereby said trench is isolated on the bottom surface thereof.

7. A semiconductor device according to claim 6, said second trench is formed to the depth of said first insulating layer, said second trench is isolated by said second insulating layer and said first insulating layer, so that said second trench is divided into one sidewall region and the other sidewall region, and the first conductive layer is formed in said one sidewall region and a fourth conductive layer is formed in a said other sidewall region.

8. A memory cell of a dynamic random access memory device having a transistor and a capacitor connected to said transistor, comprising:

a semiconductor substrate comprising a first layer of a first conductivity type, a first insulating layer formed on said first layer of the first conductivity type and a second layer of the first conductivity type having a major surface formed on said first insulating layer, said substrate having a first trench and a second trench formed in said second layer of the first conductivity type and spaced apart from the first trench;

a first source/drain region of said transistor of a second conductivity type formed on a sidewall of said first trench of said substrate;

a second source/drain region of said transistor of a second conductivity type formed on a sidewall of said second trench of said substrate opposing said first source/drain region, said second source/drain region electrically connected to a bit line formed on said sidewall of said second trench;

a gate electrode of said transistor formed above the region between the source/drain regions of said transistor with a gate insulator posed therebetween;

a first electrode of said capacitor formed electrically connected to said first source/drain region on said sidewall of said first trench; and a second electrode of said capacitor formed on said first electrode in said first trench with an insulator posed therebetween.

9. A dynamic random access memory array including a plurality of memory cells, each cell having a transistor and capacitor connected to said transistor and comprising:

a semiconductor substrate comprising a first layer of a first conductivity type, a first insulating layer formed on said first layer of the first conductivity type and a second layer of the first conductivity type having a major surface formed on said first insulating layer, said substrate having a first trench and a second trench formed in said second layer of the first conductivity type and spaced apart from the first trench;

a first source/drain region of said transistor of a second conductivity type formed on a sidewall of said first trench of said substrate;

a second source/drain region of said transistor of a second conductivity type formed on a sidewall of said second trench of said substrate opposing said first source/drain region, said second source/drain region electrically connected to a bit line formed on a sidewall of said second trench;

gate electrode of said transistor formed above the region between the source/drain regions of said transistor with a gate insulator posed therebetween;

a first electrode of said capacitor formed electrically connected to said first source/drain region on said sidewall of said first trench;

a second electrode of said capacitor formed on said first electrode in said first trench with an insulator posed therebetween;

wherein said bit line extends through a substrate plane in a direction parallel to said first trench; and said gate electrode is a portion of a word line that extends in a plane overlying said substrate plane and in a direction perpendicular to said bit line.

* * * * *